(12) United States Patent
Pache et al.

(10) Patent No.: US 8,531,261 B2
(45) Date of Patent: Sep. 10, 2013

(54) TRANSFORMER AND METHOD FOR USING SAME

(75) Inventors: Denis Pache, Grenoble (FR); Nejdat Demirel, Pessac (FR)

(73) Assignee: STMicroelectronics, S.A., Montrouge (FR)

( * ) Notice: Subject to any disclaimer, the term of this patent is extended or adjusted under 35 U.S.C. 154(b) by 328 days.

(21) Appl. No.: 12/973,363

(22) Filed: Dec. 20, 2010

(65) Prior Publication Data

US 2011/0148542 A1     Jun. 23, 2011

(30) Foreign Application Priority Data

Dec. 22, 2009   (FR) ...................................... 09 59354

(51) Int. Cl.
*H01F 27/32*   (2006.01)
*H01F 27/28*   (2006.01)

(52) U.S. Cl.
USPC ......................................... 336/84 R; 336/182

(58) Field of Classification Search
USPC ................. 333/25, 26, 238; 336/84 R, 84 C, 336/182, 200
See application file for complete search history.

(56) References Cited

U.S. PATENT DOCUMENTS

| 5,212,824 | A  | * | 5/1993  | Mishima et al. | ........... 455/188.1 |
| 7,084,728 | B2 | * | 8/2006  | Hyvonen | ..................... 336/84 C |
| 7,449,974 | B2 | * | 11/2008 | Lee et al. | ........................ 333/25 |
| 2006/0202776 | A1 | | 9/2006 | Lee et al. | |

FOREIGN PATENT DOCUMENTS

JP          61-293012        12/1986

OTHER PUBLICATIONS

Republique Franciase, Institut National De La Propriete Industrielle, Rapport de Recherche Preliminaire (Preliminary Search Report) issued in French Patent Application No. 09-59354 on Aug. 16, 2010 (2 pages).

* cited by examiner

*Primary Examiner* — Dean O Takaoka
(74) *Attorney, Agent, or Firm* — Slater & Matsil, L.L.P.

(57) ABSTRACT

Method for improving the symmetry of the differential output signals of an integrated transformer of the symmetric-asymmetric type comprising an inductive primary circuit and an inductive secondary circuit, characterized in that the capacitive coupling between the primary and secondary circuits is reduced.

20 Claims, 5 Drawing Sheets

TRANSFORMER AND METHOD FOR USING SAME

This application claims the priority benefit of French Patent Application 09/59354, which was filed Dec. 22, 2009, and entitled "Method for Improving the Symmetry of the Output Signals of an Integrated Transformer of 'Balun' Type, and Associated Integrated Circuit," which is hereby incorporated by reference.

TECHNICAL FIELD

The invention relates to integrated transformers of the symmetric-asymmetric type commonly designated by the person skilled in the art by the name "BALUN" (BALanced to UNbalanced), and more particularly the improvement of the symmetry of the differential output signals of an integrated transformer such as this.

The invention applies for example, not by way of limitation, in mobile telephony or in the field of automobile radars.

BACKGROUND

The production of silicon integrated systems, be they for power or for processing, is done increasingly with differential structures of variable reference impedance for the analogue portions of the system. The "outside" world remains, however, essentially a system of the common-mode type and of reference impedance 50 Ω.

The link between a symmetric transmission line and an asymmetric transmission line may not be produced without a suitable electrical circuit. This transition is handled by a transformer of the symmetric-asymmetric type also called a "balun".

A balun converts for example a signal of common-mode type into a signal of differential-mode type, and vice versa, and handles the impedance transformations. The main electrical characteristics of a balun are its insertion loss, which must be as low as possible, the balancing of the differential channels in phase (180°) and in amplitude ($\delta$=0 dB), and its passband, that is to say the frequency span over which the transformer is usable as a "balun" with balancing of the channels in phase and in amplitude.

Baluns can also be used for example in reception and transmission circuits of wireless communication systems, for the design of differential circuits such as amplifiers, mixers, oscillators and antenna systems.

Though the insertion loss can reduce certain aspects of performance, such as the electrical efficiency or the gain, for example, the unbalancing of the differential channels can lead to a complete malfunction of the circuit which results in a hike in the levels of the even harmonics, significant unbalancing of the differential channels, and increased impact of the connection elements on the outside world (e.g., bonding ground).

Baluns can be produced with transmission lines such as Lange couplers, couplers of circle-shaped type commonly designated by the person skilled in the art under the name "Rat-race", Marchand couplers, else with stacked or coplanar inductors.

In transmission line structures, lines of length equivalent to a quarter wavelength, $\lambda/4$, or a half wavelength, $\lambda/2$, are used for the insulations between channels and to delay one channel relative to another. By way of example, for frequencies of 2 GHz and 80 GHz, and for a metal line having a dielectric constant $\epsilon r$ equal to 4, the length values $\lambda/4$ and $\lambda/2$ correspond to 18.75 mm and 37.5 mm for 2 GHz, and 0.468 mm and 0.937 mm for 80 GHz.

Consequently, this transmission lines structure exhibits the drawback of occupying a large silicon area for microwave applications or of not being integratable for lower-frequency applications. For this reason, inductor-based structures are preferably adopted.

SUMMARY OF THE INVENTION

In one aspect, the present invention provides for an integrated circuit comprising a first inductor circuit, a second inductor circuit, and a shield element interposed the first and second inductor circuit.

In another aspect, the present invention provides for an integrated circuit including a symmetric-asymmetric transformer comprising an inductive primary circuit, an inductive secondary circuit, and reducing means for reducing the capacitive coupling between the primary circuit and the secondary circuit.

In yet another aspect, the present invention provides for a method comprising inducing in a first secondary winding a current as a result of inductive coupling of said first secondary winding with a first primary winding, wherein a shield element interposed between said first primary winding and said first secondary winding reduces capacitive coupling between said first primary winding and said first secondary winding relative to an identical structure without the shield element.

BRIEF DESCRIPTION OF THE DRAWINGS

Other advantages and characteristics of the invention will be apparent on examining the detailed description of wholly non-limiting modes of embodiment and implementation, and the appended drawings in which.

DETAILED DESCRIPTION OF ILLUSTRATIVE EMBODIMENTS

Figure 1:
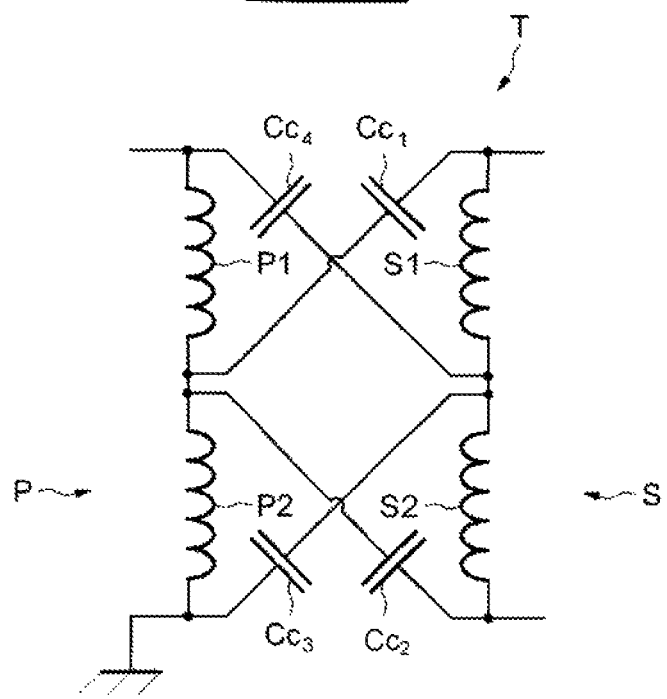
FIG. 1 illustrates an exemplary distribution of the coupling capacitances between two inductive circuits.

Before describing specific embodiments in detail, various embodiments and alternatives will be discussed generally. According to one mode of implementation and embodiment, there is proposed a balun architecture aimed at reducing, or indeed eliminating, the problem of phase and amplitude imbalance of the differential channels, preferably doing so over a frequency band reaching as far as the autoresonant frequency of the inductors used in the balun.

The inductors used can have various forms such as rectangular, octagonal or circular inductors, and exhibit a variable number of turns. The inductors can be disposed in a coplanar or stacked manner, or any possible and imaginable mixture of positions.

According to one aspect, there is thus proposed a method for improving the symmetry of the differential output signals of an integrated transformer of the symmetric-asymmetric type comprising an inductive primary circuit and an inductive secondary circuit. According to a general characteristic of this aspect, the capacitive coupling between the primary and secondary circuits is reduced.

Indeed, when the primary and secondary circuits are placed in operation, the current flowing around each of the electrical circuits creates, by electric field effect, coupling capacitances between the two inductive circuits. The inventors have observed that these coupling capacitances are essentially the cause of the asymmetry in phase and in amplitude of the differential-output channels.

The coupling capacitances affect the phase shift and the amplitude between the two output channels. Ideally, if these capacitors are removed, the phase shift is 180° and the signals are of the same amplitude over a frequency span reaching as far as the resonant frequency of the balun.

Thus, according to one mode of implementation, the reduction in capacitive coupling comprises a connection to a cold node of the coupling capacitors that are created between the primary and secondary circuits so as to discharge the current which flows therein. The cold node is for example a node coupled to ground. Advantageously, the reduction in the capacitive coupling can comprise the placement at least between the primary circuit and the secondary circuit of a "wall" or electrically conducting shielding connected to grounding.

According to another aspect, there is proposed an integrated circuit comprising a transformer of the symmetric-asymmetric type comprising an inductive primary circuit and an inductive secondary circuit. According to a general characteristic of this other aspect, the integrated circuit furthermore comprises reducing means configured to reduce the capacitive coupling against the primary circuit and the secondary circuit.

According to one embodiment, the reducing means are configured to connect to a cold node the coupling capacitors that are created between the primary and secondary circuits. The reducing means can advantageously comprise an electrically conducting shielding means connected to ground and extending at least between the primary circuit and the secondary circuit.

Advantageously, the shielding means can comprise at least one metallic layer. Advantageously, the shielding means can be openwork so as to form distinct shielding zones.

The division of the shielding means into shielding zones makes it possible to eliminate the eddy currents that may flow around the shielding means when it consists of a single block between the two inductive circuits. When they exist, these eddy currents can degrade the performance of the balun. Advantageously, the shielding means can furthermore extend along at least one of the primary and secondary circuits.

In certain cases, the electric field lines created can circumvent a shielding means disposed solely between the two inductive circuits. A shielding means furthermore extending along at least one of the primary and secondary circuits renders more effective the shielding, thus reducing or ideally precluding the persistence of a coupling capacitance between the two inductive circuits. Ideally, the shielding means would prevent circumvention of the shielding means by electric field lines.

The inductive primary circuit and the inductive secondary circuit can be at least partially coplanar and/or stacked.

Advantageously, the shielding means extends over a height corresponding to several metallization levels of the integrated circuit, so as to reduce the possibility of formation of electric field lines circumventing the shielding means.

According to another aspect, there is proposed in one embodiment an integrated circuit furthermore comprising power amplification means connected to at least one transformer of the symmetric-asymmetric type.

The power amplification means can advantageously be connected between two such transformers of symmetric-asymmetric type. The integrated circuit can advantageously furthermore comprise auxiliary capacitors connected in parallel with each of the transformers.

FIG. 1 illustrates an exemplary distribution of coupling capacitance created by an electric field effect between the primary circuit P and the secondary circuit S of an integrated transformer T of "balun" type. The coupling capacitance is represented in the figure in the form of four coupling capacitors Cc1 to Cc4 for example.

The primary circuit P and the secondary circuit S have each been divided into a first and a second inductive element coupled in series P1 and P2, and S1 and S2. The second primary inductive element P2 of the primary circuit is coupled on one side to an end of P1, and on the other side to ground, also referred to herein as earth.

The first capacitor Cc1 is coupled between the free branch of the first secondary inductive element S1 and the branch common to the first and to the second primary inductive elements P1 and P2. The second capacitor Cc2 is coupled between the free branch of the second secondary inductive element S2 and the branch common to the first and to the second primary inductive elements P1 and P2. These two capacitances Cc1 and Cc2 impact in a symmetric manner the output channels of the balun.

The third capacitor Cc3 is coupled between the branch coupled to the earth of the second primary inductive element P2 and the branch common to the first and to the second secondary inductive elements S1 and S2. The fourth capacitor Cc4 is coupled between the free branch of the first primary inductive element P1 and the branch common to the first and to the second secondary inductive elements S1 and S2. The third capacitor Cc3 being coupled to the earth whereas the fourth capacitor Cc4 is not, these two capacitors Cc3 and Cc4 are the cause of the asymmetry of the output channels.

Other orientations of the inductors give a different distribution of the coupling capacitances but one and the same conclusion.

Figure 2:
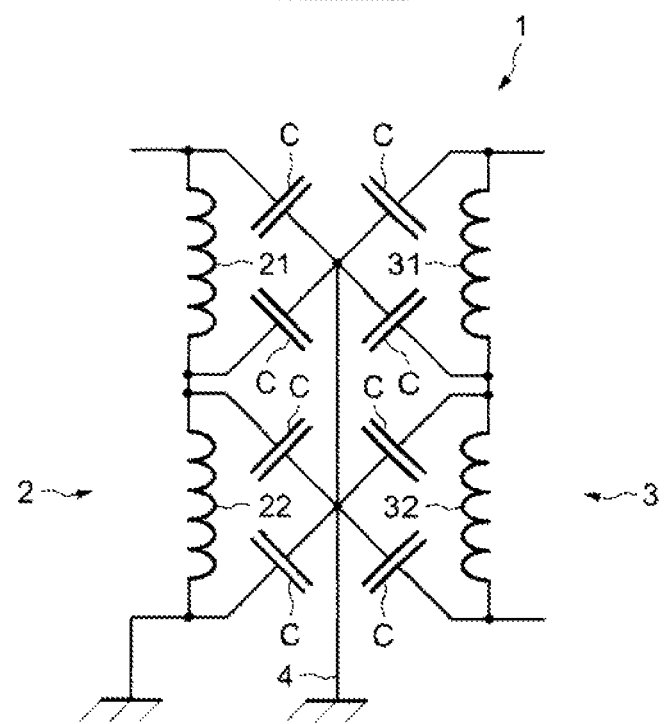
FIG. 2 represents an electrical diagram of an integrated transformer of "balun" type according to an embodiment of the invention.

FIG. 2 represents an electrical diagram of an integrated transformer of "balun" type according to an embodiment of the invention.

The transformer 1 comprises an inductive primary circuit 2 and an inductive secondary circuit 3. The inductive primary circuit 2 is formed, in this example, of a first primary coil 21 and of a second primary coil 22. The secondary circuit 3 is formed of a first secondary coil 31 and of a second secondary coil 32. The second primary coil 22 is coupled at output to the earth.

When the current flows around the primary circuit and around the secondary circuit, an electric field forms between the two inductive circuits. By electric field effect a capacitive coupling is produced between the two inductive circuits 2 and 3. This capacitive coupling represented here by coupling capacitors C is reduced, or preferably eliminated, by conveying these capacitors C back to a cold node so as to discharge the current which flows therein. To convey these capacitors C to a cold node, they are coupled to earth.

As will now be seen in greater detail, one way of connecting these coupling capacitors to earth comprises the placement of a shielding between the inductive circuits and connecting this shielding to earth.

Figure 3:
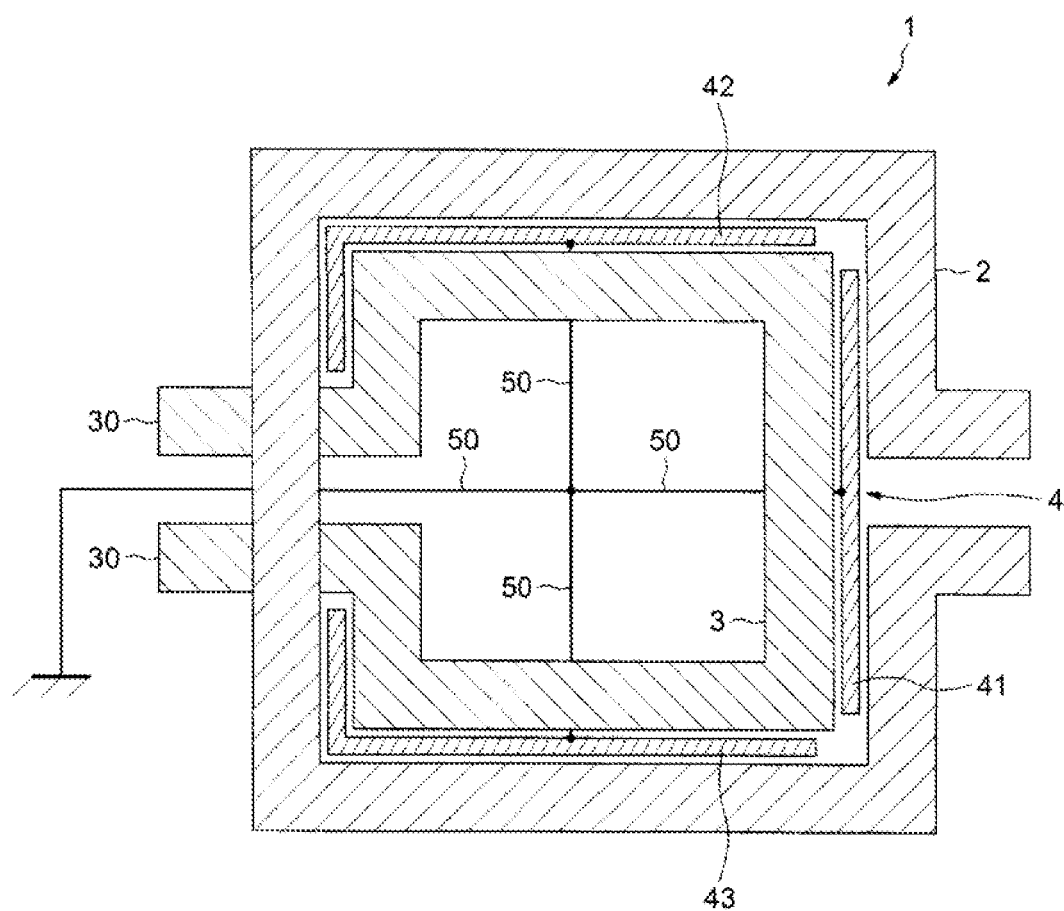
FIG. 3 represents in a schematic manner an exemplary integrated circuit embodiment, therefore comprising a transformer according to an embodiment of the invention.

FIG. 3 schematically represents an exemplary embodiment of a transformer of "balun" type according to an embodiment of the invention, produced within an integrated circuit.

The transformer 1 of balun type comprises an inductive primary circuit 2 as well as an inductive secondary circuit 3 situated in one and the same plane, for example on one and the same metallization level of the integrated circuit. The inductive secondary circuit 3 is nested within the inductive primary circuit 2.

The connections 30 of the inductive secondary circuit 3 are produced so as to pass below the inductive primary circuit 2, therefore in a different plane from the inductive primary circuit 2 and from the inductive secondary circuit 3. This is, for example, achieved by vias and junctions of metal lines situated at a lower initial level.

Between the primary circuit 2 and the inductive secondary circuit 3 are disposed reducing means configured to reduce the capacitive coupling between the primary circuit 2 and the secondary circuit 3. The reducing means comprise here a conducting shielding means 4 connected to earth via connections 50. In this example, the shielding means comprises a metallic wall extending over a height corresponding to several metallization levels of the integrated circuit. Thus, for example, if the inductors are situated at the metal level "3", the shielding can extend from the metal level "1" to the metal level "6".

The shielding means 4 is openwork so as to form distinct shielding zones 41, 42 and 43. The shielding means is thus formed of a first shielding zone 41, of a second shielding zone 42 and of a third shielding zone 43.

These distinct shielding zones physically separated from one another make it possible to avoid having a shielding means 40 formed of a single block right around the secondary circuit 3 between the secondary circuit 3 and the primary circuit 2. Indeed, when the current flows around a shielding means 4 formed of a single block, eddy currents can form in this shielding means 4, degrading the performance of the balun.

Figure 4A:
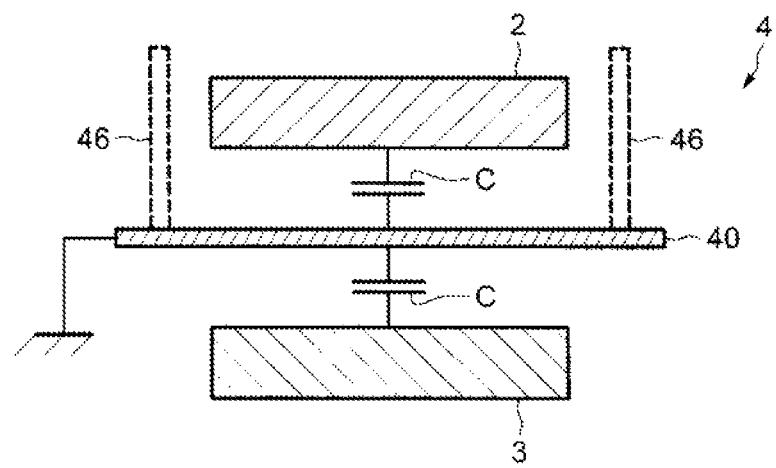
FIGS. 4a and 4b represent in a schematic manner a first and a second embodiment of a shielding means according to an embodiment of the invention.
Figure 4B:
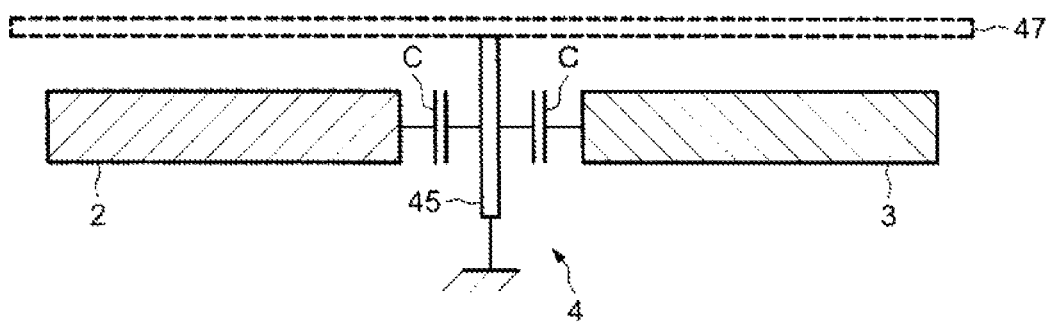

FIGS. 4a and 4b schematically present two other examples of embodiments of the invention.

FIG. 4a illustrates an exemplary embodiment of the invention in a case where the baluns are of stacked type, that is to say the inductive primary circuit 2 is below or above the inductive secondary circuit 3. In this configuration, the reducing means comprise an electrically conducting shielding means 4 connected to earth and extending at least between the primary circuit 2 and the secondary circuit 3, that is to say comprising a shielding 40 between the inductive circuits.

As a variant, the shielding means 4 can also extend along at least one of the primary 2 and secondary 3 circuits. Thus, it is possible to have at least one stretch 46 of the shielding means 4 extending along the primary circuit 2, perpendicularly to the shielding 40. It is preferably possible to have two shielding stretches 46 extending along at least one of the primary 2 and secondary 3 circuits, and disposed perpendicular to the shielding 40.

FIG. 4b illustrates an exemplary embodiment of the invention in a configuration where the baluns are of planar or coplanar type, that is to say situated in one and the same plane. In this case, the reducing means comprise a shielding 45 between the inductive circuits, connected to earth so as to reduce the capacitive coupling between the two inductive circuits.

As in the case of FIG. 4a, it is possible to add a shielding stretch 47, or lateral shielding, extending at least along one of the primary 2 and secondary 3 circuits. This lateral shielding is coupled to the shielding 45. The shielding 45 and the lateral shielding 47 can be two distinct elements coupled together, or a one-piece element.

Whether it be in FIG. 4a or in FIG. 4b, the shielding stretch makes it possible to reduce the risk of circumvention of the shielding 40 or 45 by field lines, or indeed preferably to eliminate it.

Figure 5A:
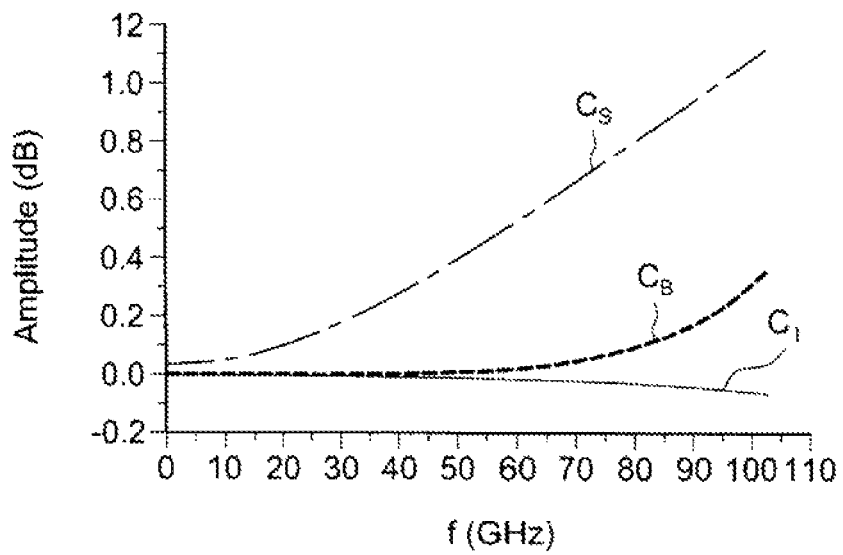
FIGS. 5a and 5b illustrate the imbalances of the output channels in phase and in amplitude for cases without shielding and with shielding and an ideal case.
Figure 5B:
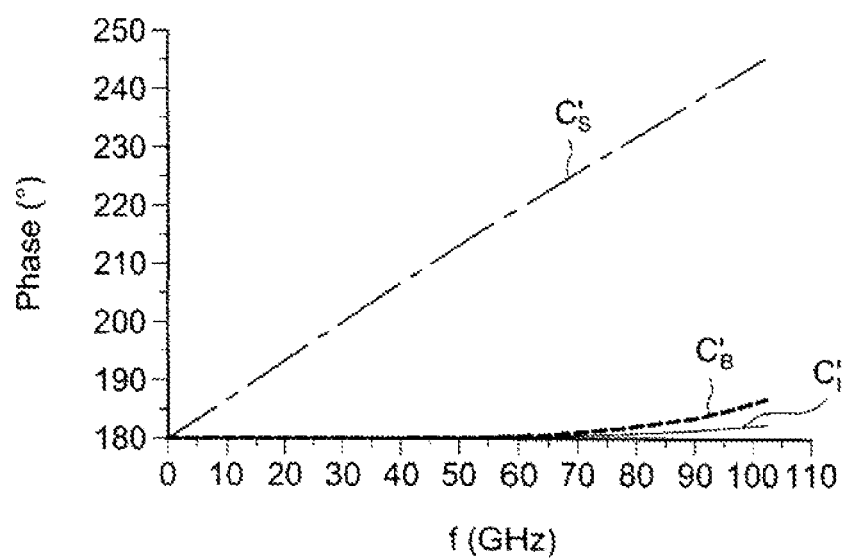

FIGS. 5a and 5b show the imbalances of the output channels in phase and in amplitude for a configuration without shielding and a configuration according to the invention, and in an ideal case where there would be no capacitive coupling.

FIG. 5a is a graphical representation of the unbalancing in amplitude, expressed in dB, as a function of frequency expressed in GHz. Three curves have been represented. A curve $C_I$ represents the ideal case where there is no capacitive coupling between the inductive primary circuit 2 and the inductive secondary circuit 3. A curve $C_B$ represents the unbalancing in amplitude in a configuration with shielding according to the invention. A curve $C_S$ represents the unbalancing in amplitude in a configuration without shielding. For curves $C_B$ and $C_S$ the overall coupling capacitance is taken equal to 20 fF.

It may be read on the graphic that at 80 GHz, by virtue of the shielding, the imbalance in amplitude of the output channels is brought down from 0.8 dB to 0.1 dB. This being at 0.1 dB of the ideal case read on the curve $C_I$.

FIG. 5b presents a graphical representation of the imbalances in phase, expressed in degrees, of the output channels as a function of frequency in GHz. Three curves have also been represented. A curve $C'_I$ represents the ideal case where there is no coupling. A curve $C'_B$ represents the evolution for a configuration of the described embodiments of this invention, that is to say with shielding. Finally curve $C'_S$ represents the evolution for a configuration without shielding. Here again, the overall coupling capacitance is taken equal to 20 fF.

It may be read on the graphical representation that at 80 GHZ, by virtue of the shielding, the imbalance in phase of the output channels is brought down from 55° to 2.4°.

Thus in this case, a balun comprising means for reducing capacitive coupling therefore possess imbalances in amplitude and in phase that are almost zero over the whole of the band of use from 0 to 70 GHz, thereby enabling the generation of truly differential signals (180° of phase shift) over the whole of this passband.

Figure 6:
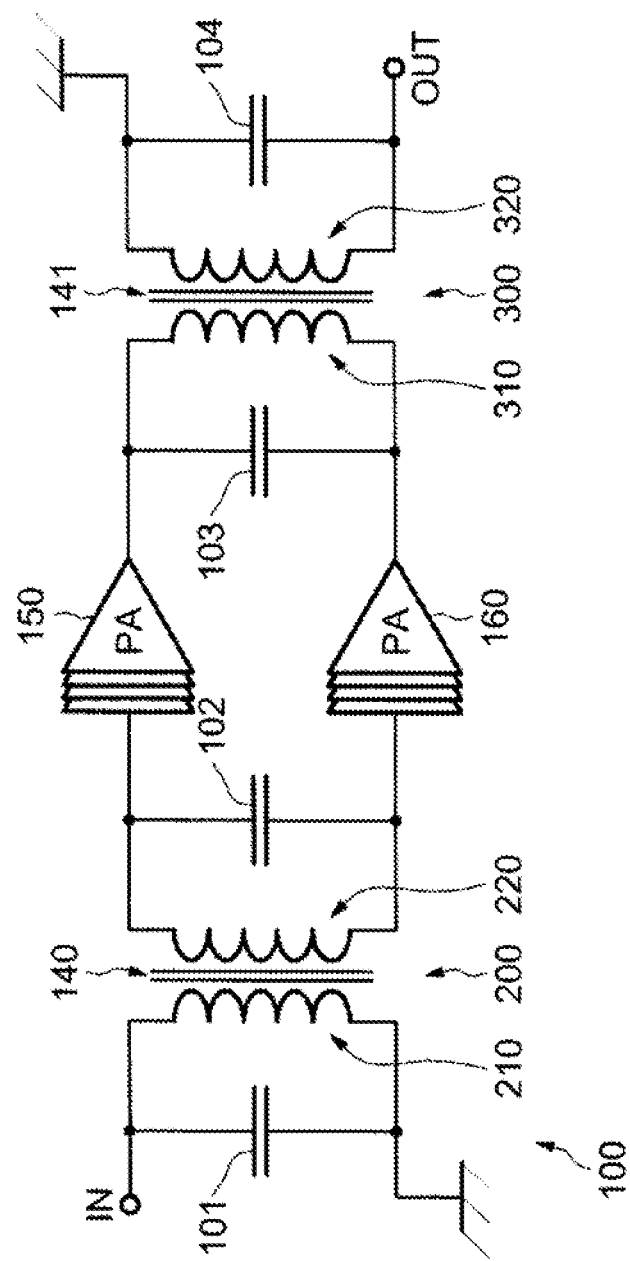
FIG. 6 illustrates an example according to an embodiment of a power amplifier comprising two integrated baluns.

FIG. 6 represents an exemplary embodiment of an 80-GHz power amplifier comprising two integrated transformers of balun type according to an embodiment of the invention.

This power amplifier 100 comprises a first auxiliary capacitor 101 coupled between an input IN and earth and coupled in parallel to a first primary circuit 210. This first primary circuit forms with a second primary circuit 220 a first integrated transformer 200 of balun type comprising reducing means 140 making it possible to reduce or eliminate the capacitive coupling between the primary circuit 210 and the first secondary circuit 220. The secondary circuit 220 is coupled in parallel with a second auxiliary capacitor 102. This auxiliary capacitor 102 is coupled at one end to a first amplifier 150 and is also coupled at its second end to a second amplifier 160. The first amplifier 150 is coupled at output to a first end of a third auxiliary capacitor 103. The second amplifier 160 is coupled at output to a second end of the third auxiliary capacitor 103. The third auxiliary capacitor 103 is coupled in parallel to a second primary circuit 310 which forms with a second secondary circuit 320 a second integrated transformer 300 of balun type also comprising reducing means 141 making it possible to reduce or eliminate the capacitive coupling between the second primary circuit 310 and the second secondary circuit 320. The second secondary circuit is coupled in parallel to a fourth auxiliary capacitor 104 of which a first end is coupled to earth and a second end is coupled to the output OUT.

The 80-GHz power amplifier comprising two baluns integrated according to the embodiment of the invention makes it possible to increase the output power by 3 dBm with respect to a structure with a single integrated transformer of balun type. This power amplifier can be used for test structures for differential circuits. The addition of the capacitors in parallel is carried out so as to tailor the balun in the desired frequency band and to reduce the losses.

What is claimed is:

1. An integrated circuit comprising:
   a first inductor circuit, the first inductor circuit comprising a first coil and a second coil;
   a second inductor circuit; and
   a shield element interposed the first and second inductor circuit, wherein the first and second inductor circuits and the shield element are in a common metal layer of said integrated circuit.

2. The integrated circuit of claim 1 wherein said shield element is a grounded conductor.

3. The integrated circuit of claim 1, wherein the first inductor circuit surrounds the second inductor circuit.

4. The integrated circuit of claim 1, wherein the shield element comprises at least two physically separated sections.

5. The integrated circuit of claim 1, wherein the shield element extends through at least two metal layers.

6. The integrated circuit of claim 1, wherein the shield element extends along at least one of the first inductor circuit and the second inductor circuit.

7. An integrated circuit including a symmetric-asymmetric transformer comprising:
   an inductive primary circuit;
   an inductive secondary circuit; and
   reducing means for reducing the capacitive coupling between the primary circuit and the secondary circuit, wherein the reducing means comprises cold node coupling capacitors that are created between the inductive primary and inductive secondary circuits.

8. The integrated circuit according to claim 7, in which the reducing means comprises an electrically conducting shield connected to earth and extending at least between the inductive primary circuit and the inductive secondary circuit.

9. The integrated circuit according to claim 8, in which the shield comprises at least one metallic layer.

10. The integrated circuit according to claim 8, in which the shield is physically separated into sections so as to form distinct shielding zones.

11. The integrated circuit according to claim 8, in which the shield furthermore extends along at least one of the inductive primary and inductive secondary circuits.

12. The integrated circuit according to claim 8, wherein the shield extends over a height corresponding to a plurality of metallization levels of the integrated circuit.

13. The integrated circuit according to claim 7, wherein the inductive primary circuit and the inductive secondary circuit are coplanar.

14. The integrated circuit according to claim 7, wherein the inductive primary circuit and the inductive secondary circuit are stacked.

15. The integrated circuit according to claim 7, further comprising power amplification means connected to said symmetric-asymmetric transformer.

16. The integrated circuit according to claim 15, in which the power amplification means is connected between two symmetric-asymmetric transformers.

17. The integrated circuit according to claim 7, further comprising auxiliary capacitors connected in parallel with each respective symmetric-asymmetric transformer.

18. A method comprising:
   inducing in a first secondary winding a current as a result of inductive coupling of said first secondary winding with a first primary winding;
   wherein a shield element interposed between said first primary winding and said first secondary winding reduces capacitive coupling between said first primary winding and said first secondary winding relative to an identical structure without the shield element;
   inducing in a second secondary winding a second current as a result of inductive coupling of said second secondary winding with a second primary winding;
   wherein a second shield element interposed between said second primary winding and said secondary winding reduces capacitive coupling between said second primary winding and said second secondary winding relative to an identical structure without the second shield element.

19. The method of claim 18 further comprising:
   receiving a signal from said first secondary winding; and amplifying said signal.

20. The method of claim 19 further comprising:
   receiving at said second primary winding said amplified signal.

* * * * *